(12) United States Patent
Wang et al.

(10) Patent No.: US 12,218,154 B2
(45) Date of Patent: Feb. 4, 2025

(54) ARRAY SUBSTRATE COMPRISING A BINDING REGION HAVING A BINDING ZONE AND A VACANCY ZONE ALTERNATELY DISPOSED AND DISPLAY APPARATUS THEREOF

(71) Applicants: Chongqing BOE Optoelectronics Technology Co., Ltd., Chongqing (CN); BOE Technology Group Co., Ltd., Beijing (CN)

(72) Inventors: Xiaoyuan Wang, Beijing (CN); Yan Fang, Beijing (CN); Junhui Wu, Beijing (CN); Jiantao Liu, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 597 days.

(21) Appl. No.: 17/401,273

(22) Filed: Aug. 12, 2021

(65) Prior Publication Data

US 2022/0085076 A1 Mar. 17, 2022

(30) Foreign Application Priority Data

Sep. 17, 2020 (CN) .......................... 202022044723.5

(51) Int. Cl.
| | | |
|---|---|---|
| H01L 27/12 | (2006.01) |
| G02F 1/1333 | (2006.01) |
| G02F 1/1337 | (2006.01) |
| G02F 1/1345 | (2006.01) |
| G02F 1/1362 | (2006.01) |

(Continued)

(52) U.S. Cl.
CPC .... *H01L 27/1248* (2013.01); *G02F 1/133357* (2021.01); *H01L 24/06* (2013.01); *G02F 1/133784* (2013.01); *G02F 1/13456* (2021.01); *G02F 1/136222* (2021.01); *H01L 23/544* (2013.01); *H01L 2223/54433* (2013.01);

(Continued)

(58) Field of Classification Search
CPC ....... G02F 1/13456; H01L 2224/06165; H01L 2224/06515
See application file for complete search history.

(56) References Cited

U.S. PATENT DOCUMENTS

| | | | | |
|---|---|---|---|---|
| 2004/0036830 A1* | 2/2004 | Murai | ...................... | H05K 3/24 438/30 |
| 2021/0233939 A1 | 7/2021 | Wang et al. | | |

FOREIGN PATENT DOCUMENTS

| | | | | | |
|---|---|---|---|---|---|
| CN | 109884830 A | * | 6/2019 | ........... | G02F 1/1345 |
| CN | 111740013 A | * | 10/2020 | ............. | G09F 9/301 |

* cited by examiner

*Primary Examiner* — Paul C Lee
(74) *Attorney, Agent, or Firm* — Ling Wu; Stephen Yang; Ling and Yang Intellectual Property (57) ABSTRACT

Provided are an array substrate and a display apparatus thereof. The array substrate includes a display region and a binding region located at a side of the display region; the binding region includes a first conductive layer disposed on the substrate and a planarization layer disposed at a side of the first conductive layer away from the substrate. The binding region includes a binding zone and a vacancy zone alternately disposed along an edge of the display region, the first conductive layer includes a plurality of binding pins disposed in the binding zone, and the planarization layer is provided with first openings exposing the plurality of binding pins and covering the binding zone and the vacancy zone.

16 Claims, 8 Drawing Sheets

(51) Int. Cl.
*H01L 23/00* (2006.01)
*H01L 23/544* (2006.01)
(52) U.S. Cl.
CPC .............. *H01L 2224/06165* (2013.01); *H01L 2224/06515* (2013.01)

ARRAY SUBSTRATE COMPRISING A BINDING REGION HAVING A BINDING ZONE AND A VACANCY ZONE ALTERNATELY DISPOSED AND DISPLAY APPARATUS THEREOF

CROSS-REFERENCE TO RELATED APPLICATION

The present application claims the priority of Chinese Patent Application No. 202022044723.5 filed to the CNIPA on Sep. 17, 2020, the content of which is incorporated herein by reference.

TECHNICAL FIELD

The embodiments of the present disclosure relate to the field of display technology, and more specifically, to an array substrate and a display apparatus thereof.

BACKGROUND

With a continuous development of display technology, Liquid Crystal Display has become a mainstream display apparatus in the market. COA (Color Filter On Array) technology forms a color filter layer by coating the color filter material on a completed array substrate, so it is a technology that integrates the color filter with the array substrate. COA technology may reduce a difficulty of rubbing process between an array substrate and a color film substrate, thereby improving an aperture ratio of a liquid crystal display apparatus and reducing production costs.

Rubbing process of contact friction is a kind of rubbing process for liquid crystal display apparatuses. The rubbing process is to comb a surface of an alignment film by fluff on a surface of rubbing cloth, and form a molecular channel along a rubbing direction on the alignment film. However, the display apparatus based on the COA technology is prone to produce Rubbing Mura, which has a defect in fine stripes in the Rubbing process of contact rubbing. Mura refers to a phenomenon that the display brightness and chromaticity are uneven when the display apparatus is lit.

Contents of Utility Model

The below is a summary of the subject matter described herein in detail. The summary is not intended to limit the scope of protection of the claims.

An embodiment of the present disclosure provides an array substrate, which includes a display region and a binding region located at a side of the display region; the binding region includes a first conductive layer disposed on the substrate and a planarization layer disposed at a side of the first conductive layer away from the substrate. The binding region includes a binding zone and a vacancy zone alternately disposed along an edge of the display region, the first conductive layer includes a plurality of binding pins disposed in the binding zone, and the planarization layer is provided with first openings exposing the plurality of binding pins and covering the binding zone and the vacancy zone.

In an exemplary embodiment, the binding region extends along an edge of the display region, and widths of the binding zone and the vacancy zone is the same as widths of the binding pins in a direction perpendicular to an extending direction of the binding zone.

In an exemplary embodiment, the first opening covers the entire binding region.

In an exemplary embodiment, the first conductive layer further includes occupation pins disposed in the vacancy zone, and the occupation pins and the binding pins are disposed at intervals along the edge of the display region.

In an exemplary embodiment, the binding pin and the occupation pin have a same structure.

In an exemplary embodiment, distances between the adjacent binding pins, between the adjacent occupation pins and between the adjacent occupation pin and binding pin are the same.

In an exemplary embodiment, the binding region further includes a substrate mark disposed on the substrate, and the first opening includes an avoidance zone avoiding the substrate mark.

In an exemplary embodiment, the display region includes an array structure layer disposed on the substrate and a color filter layer disposed on the array structure layer, and the planarization layer covers the color filter layer.

In an exemplary embodiment, the binding region further includes a passivation layer, which is disposed between the first conductive layer and the planarization layer, and the passivation layer is provided with a second opening, and an orthographic projection of the first opening on the substrate overlaps an orthographic projection of the second opening on the substrate.

In an exemplary embodiment, the binding region further includes a second conductive layer disposed in the first opening, and the second conductive layer includes a plurality of conductive units disposed at intervals, and the plurality of conductive units and the binding pins are in a one-to-one correspondence; or, the plurality of conductive units are in a one-to-one correspondence with the binding pins and the occupation pins.

An embodiment of the present disclosure further provides a display apparatus which includes any one of the above array substrate.

Other features and advantages of the disclosure will be described in the following description, and will be partially apparent from the description, or understood by implementing the disclosure. Purposes and other advantages of the present disclosure may be achieved and acquired by structures specified in the detailed description and drawings.

After the drawings and the detailed descriptions are read and understood, the other aspects may be comprehended.

BRIEF DESCRIPTION OF DRAWINGS

The drawings are used to provide a further understanding of the technical solution of the present disclosure and constitute a part of the description, and are used together with the embodiments of the present disclosure to explain the technical solution of the present disclosure without limiting the technical solution of the present disclosure.

FIG. 2b is a sectional view at the position A-A in FIG. 2a;

FIG. 3b is a sectional view at the position A-A in FIG. 3a;

FIG. 4b is a sectional view at the position A-A in FIG. 4a;

FIG. 6b is an enlarged view at the position A in FIG. 6a;

FIG. 7b is a sectional view at the position A-A in FIG. 7a;

DETAILED DESCRIPTION

The embodiments of the present disclosure are described below with reference to the accompanying drawings. Without conflict, the embodiments in the present disclosure and the features in the embodiments may be randomly combined with each other.

Technical solutions of embodiments of the present disclosure will described clearly and completely in combination with the drawings of embodiments of the present disclosure. Apparently, the described embodiments are a part of the embodiments of the present disclosure, not all of the embodiments. Based on the described embodiments of the present disclosure, all other embodiments obtained by those of ordinary skill in the art without creative work are within the protection scope of the present disclosure.

Unless otherwise defined, technical terms or scientific terms used in the present disclosure should have the common meaning understood by those skilled in the art of the present disclosure. "First", "second", and similar terms used in the disclosure do not represent any sequence, number, or significance but are only adopted to distinguish different components. Terms "include", "comprise" or the like means that the element or object appearing before the terms covers the elements or objects listed after the terms and there equivalents without excluding other elements or objects. "Connect", "interconnect", or similar words are not limited to physical or mechanical connection but may include electrical connection, either direct or indirect.

A COA-based display apparatus may on one hand improve a pixel aperture ratio, on the other hand, save process steps and reduce a process difficulty by preparing a color filter layer on an array substrate. Especially, when applied to curved surface products, the display apparatus based on the COA technology may also avoid poor light leakage with better product competitiveness.

Figure 1:
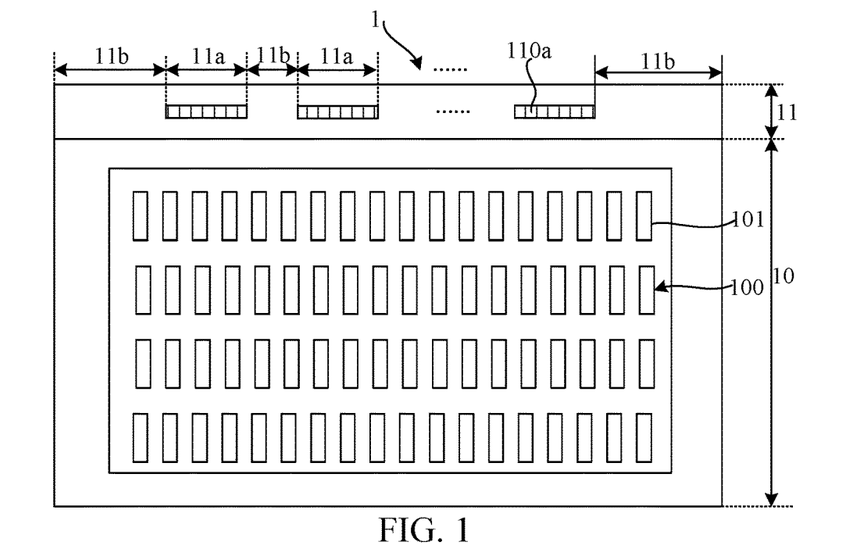
FIG. 1 is a schematic diagram of a structure of an array substrate based on COA technology.

FIG. 1 is a schematic diagram of a structure of an array substrate based on COA technology. The array substrate 1 includes a display region 10 and a binding region 11 on a side of the display region. The display region 10 includes a color filter layer 100 including a plurality of color blocks 101 arranged in an array, and the color blocks 101 may include red color blocks, blue color blocks and green color blocks. The binding region 11 includes a plurality of binding pins 110a disposed along an edge of the display region 10 at intervals, and the binding pins 110a are used for binding with driving chips, and the driving signals are connected to thin film transistors on the display region 10 through fan-out wires to realize signal input. The driving chip may be an integrated circuit (IC) or a Chip on Film (COF). The binding region 11 includes binding zones 11a and vacancy zones 11b alternately disposed along the edge of the display region 10, and the binding pins 110a are disposed in the binding zones 11a. The binding zone 11a extends along the edge of the display region 10. In a direction perpendicular to an extending direction of the binding zone 11a, widths of the binding zone 11a and the vacancy zone 11b are the same as those of the binding pins 110a. "Same" here may mean completely the same, or may mean that the widths of the binding zone 11a and the vacancy zone 11b are slightly larger than the widths of the binding pins 110a, for example, the widths of the binding zone 11a and the vacancy zone 11b are 1.1 to 1.3 times those of the binding pin 110a.

Figure 2A:
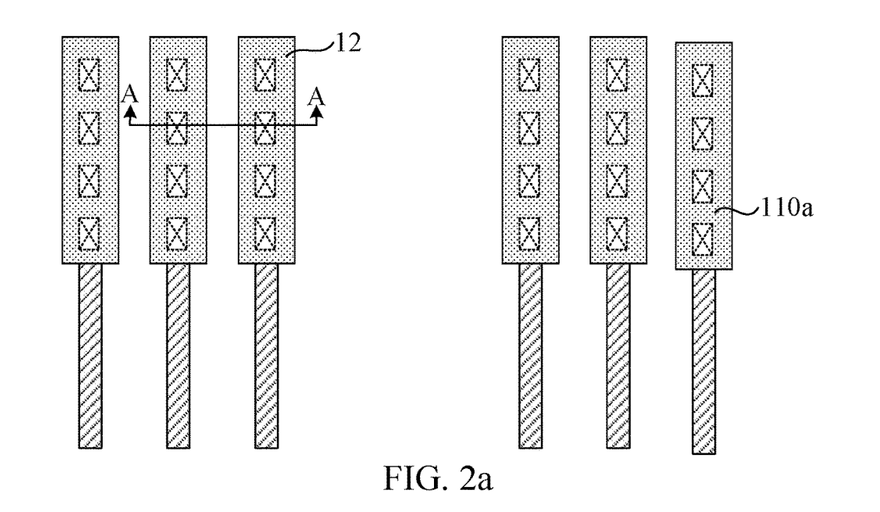
FIG. 2a is a plan view of another array substrate binding region.
Figure 2B:
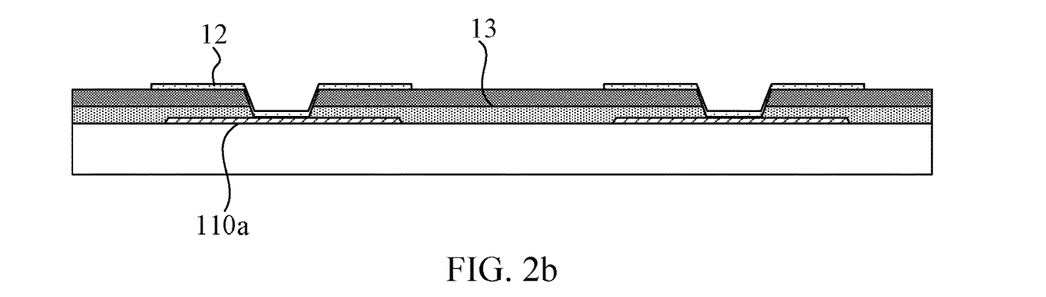

In the array substrate based on the COA technology, in the binding region, the binding pin is provided with an insulating layer, the insulating layer is provided with a planarization layer and the planarization layer is provided with a conductive layer. In the display region, the planarization layer covers a color filter layer, and the planarization layer may balance a step difference of the color filter layer, thereby improving the flatness of the array substrate and reducing the product load. The planarization layer may also be called an Organic layer (ORG) with a general thickness of above 2 microns. FIGS. 2a and 2b show a connection mode between the binding pins 110a of the binding region of a conventional array substrate (not based on the COA technology) and conductive layers 12. As shown in FIG. 2a and FIG. 2b, there is no planarization layer in the conventional array substrate, and the conductive layer 12 is connected to the binding pin 110a through a via hole disposed on an insulating layer 13, and the conductive layer 12 completely covers the binding pin 110a in general. A thickness of the insulating layer 13 is generally kilo-angstrom (a common film thickness is 4000 angstroms). Since the insulating layer 13 is thin, the via hole is small (generally smaller than 10 microns) and shallow, and the conductive layer 12 in the via hole may contact with an anisotropic conductive adhesive, and thus the driving chip may almost contact with the conductive layer 12 of the entire binding pin 110a, with large contact area, small resistance and good connectivity. For the array substrate based on COA technology, if the conductive layer and the binding pin are electrically connected by making via holes on the planarization layer, the via holes on the planarization layer need to be made very large (about 20 microns in diameter), but the width of the binding pin 110a is usually smaller than 20 microns, and thus it is impossible to effectively open holes. On the other hand, since the via holes on the planarization layer are deep and a material of the planarization layer is soft, problems such as deformation of the via holes on the planarization layer are easy to occur in the subsequent binding process. Therefore, an electrical connection between the conductive layer and the binding pin may not be realized by forming via holes. In some embodiments, a connection between the conductive layer and the binding pin of the COA array substrate may be realized in the following two modes.

Mode 1

Figure 3A:
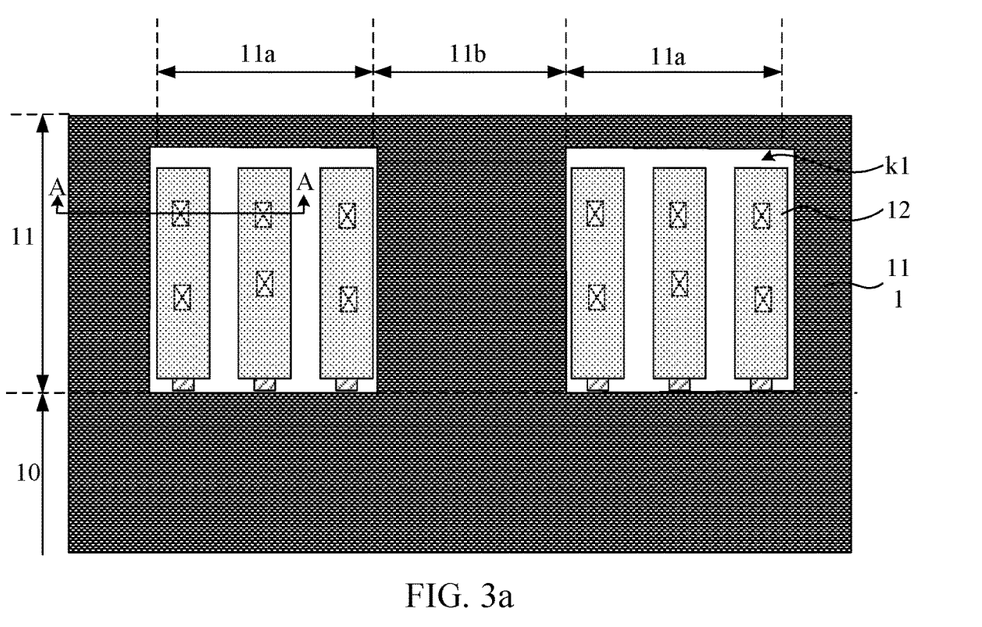
FIG. 3a is a plan view of another array substrate binding region.
Figure 3B:
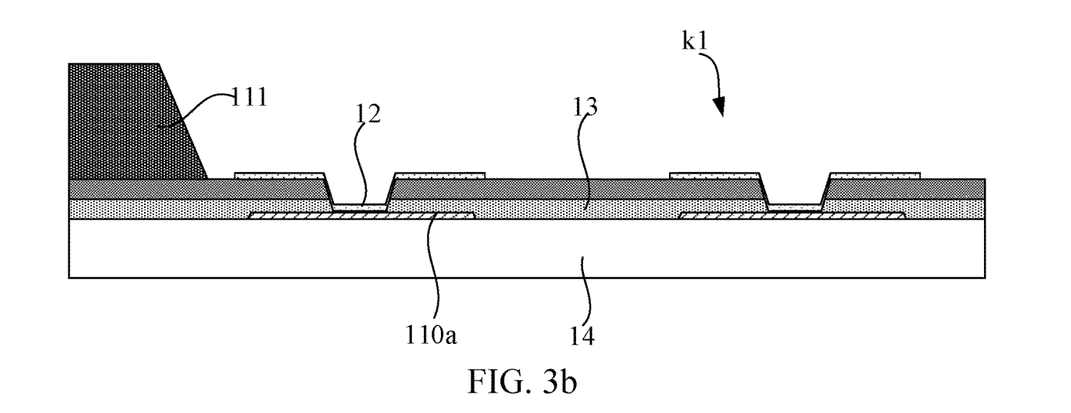

FIG. 3a is a plan view of another array substrate binding region, and FIG. 3b is a sectional view at the position A-A in FIG. 3a. As shown in FIGS. 3a and 3b, after the planarization layer 111 is masked, exposed and developed, an opening k1 is formed on the planarization layer 111 in the binding region, which is located in the binding zone 11a and in a one-to-one correspondence. An orthographic projection of the opening k1 on a substrate 14 overlaps an orthographic projection of the binding zone 11a on the substrate 14, and the planarization layer 111 in the opening k1 is etched away to expose the insulating layer 13. In a process of forming the opening k1, a film structure of the vacancy zone 11b does not change, that is, the planarization layer 111 of the vacancy zone 11b is not etched away. Patterning the insulating layer 13 through a patterning process, and forming a via hole on the insulating layer 13 of the binding zone 11a, wherein the insulating layer 13 in the via hole is etched away to expose the binding pin 110a, and the via hole corresponds to a position of the binding pin 110a. The conductive layer 12 is connected to the binding pin 110a through a via hole. In this way, a structure in the opening k1 of the binding region is basically the same as that of the binding region of the conventional array substrate (as shown in FIG. 2b), and oxidation corrosion of the binding pin 110a may be avoided. However, a patterning process needs to be added in the above-mentioned mode, which increases the cost and affects the productivity. In addition, in the subsequent process, a pixel electrode of the display region needs to be connected to a drain electrode (or source electrode) of the thin film transistor through the via hole disposed on the planarization layer, and use of the patterning process may easily lead to an increase in a slope of a sidewall of the via hole on the planarization layer in the display region, resulting in a fracture of the subsequent pixel electrode in the via hole and a poor connection between the pixel electrode and the drain electrode (or source electrode), thereby affecting product yield.

Mode 2

Figure 4A:
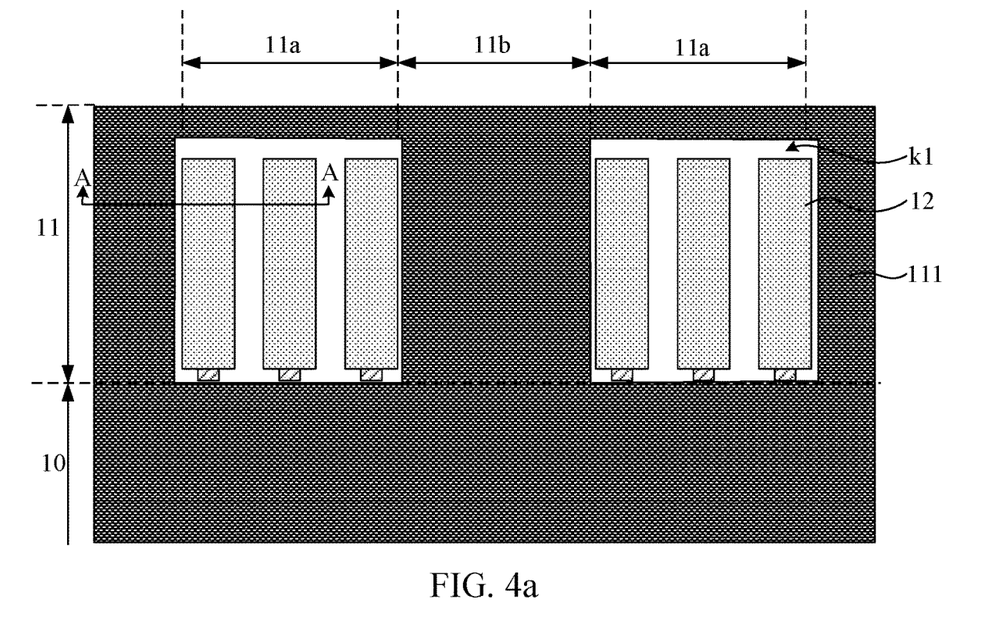
FIG. 4a is a plan view of another array substrate binding region.
Figure 4B:
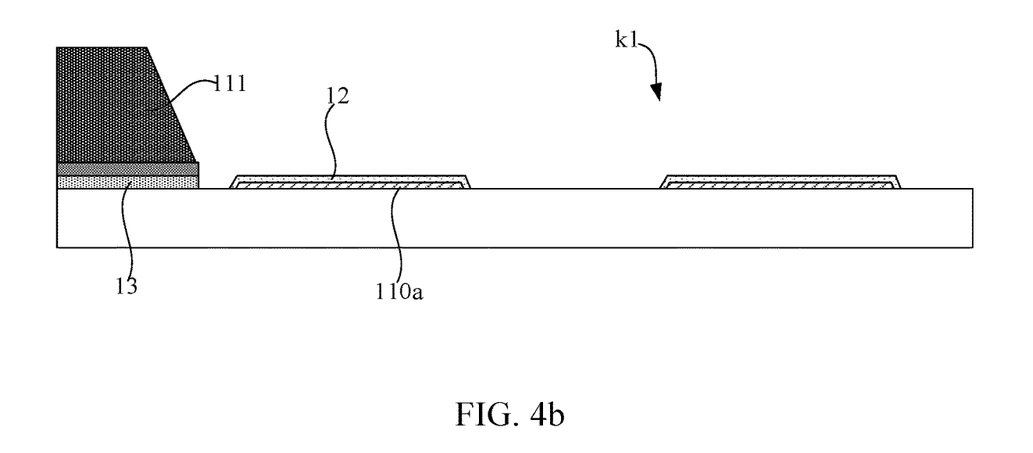

FIG. 4a is a plan view of another array substrate binding region, and FIG. 4b is a sectional view at the position A-A in FIG. 4a. As shown in FIGS. 4a and 4b, after the planarization layer 111 is masked, exposed and developed, an opening k1 is formed in the planarization layer of the binding region and exposes the insulating layer 13. The opening k1 is located in the binding zone 11a and in a one-to-one correspondence. An orthographic projection of the opening k1 on the substrate 14 overlaps an orthographic projection of the binding zone 11a on the substrate 14, and the planarization layer in the opening k1 is etched away to expose the insulating layer 13. In a process of forming the opening k1, a film structure of the vacancy zone 11b does not change, that is, the planarization layer 111 of the vacancy zone is not etched away. Then, the planarization layer 111 is directly used as a mask, the insulating layer 13 is etched away to expose the binding pin 110a, and the conductive layer 12 may be directly connected to the exposed binding pin 110a. A patterning process is not required in the above mode to reduce the production cost.

Figure 5A:
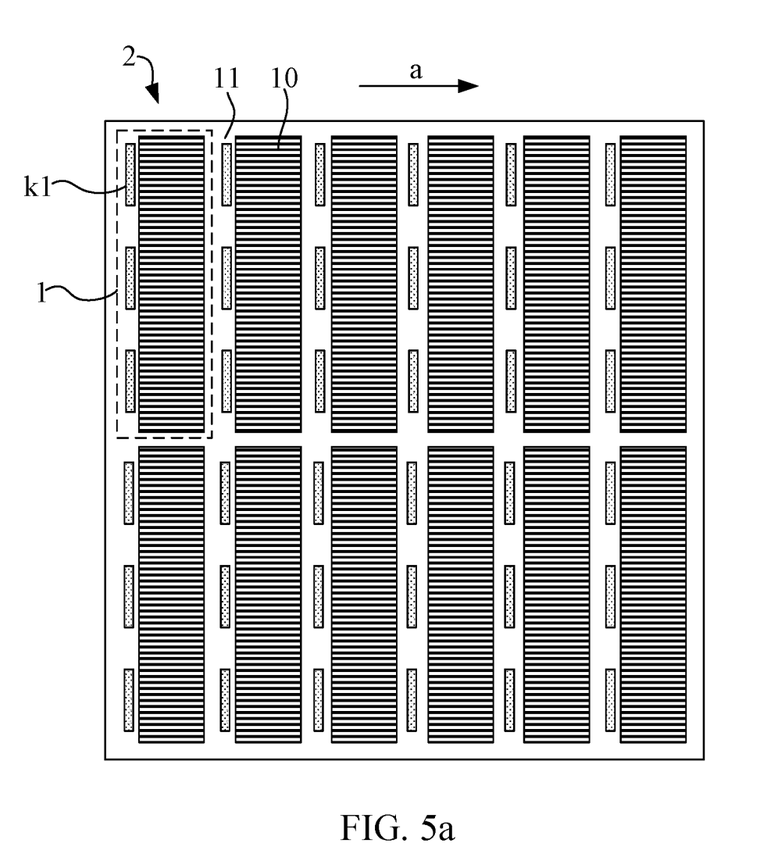
FIG. 5a is a rubbing process diagram of an array motherboard.
Figure 5B:
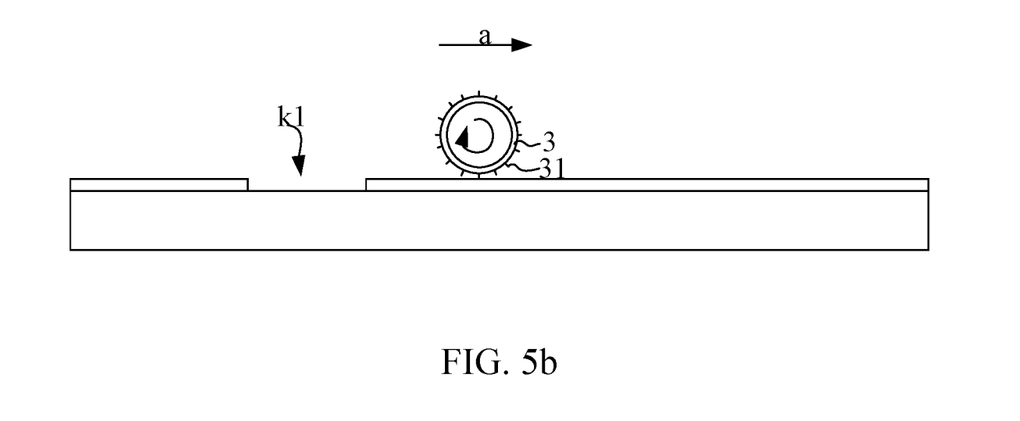
FIG. 5b is a side view of an array motherboard rubbing process.

FIG. 5a is a rubbing process diagram of an array motherboard; and FIG. 5b is a side view of an array motherboard rubbing process. In both mode 1 and mode 2, the opening k1 is formed by developing, the planarization layer inside the opening k1 is removed, and the planarization layer outside the opening k1 is not removed. There is a thickness difference inside the opening k1 and outside the opening k1, that is, a step difference. FIGS. 5a and 5b show a rubbing process of an array motherboard 2. The array motherboard 2 is scribed to form an array substrate 1, that is, the array motherboard 2 includes a plurality of array substrates 1. When combing a surface of an alignment film along from the binding region to the display region (direction a as shown in FIG. 5a) by the rubbing process, fluff 31 on a surface of rubbing cloth 3 is in at least two environments, i.e., an environment inside the opening k1 and an environment outside the opening k1, and states of the fluff 31 on the surface of the rubbing cloth 3 in different environments are different. Since a distance between the rubbing cloth 3 and a rubbing surface outside the opening k1 is smaller than a rubbing surface inside the opening k1, a compression state of the fluff 31 on the surface outside the opening k1 is greater than a compression state of the fluff 31 on the surface inside the opening k1, resulting in different elastic forces of the fluff 31 on the surface. In the process of rubbing, differences in state of the fluff 31 on the surface easily leads to uneven channels, further resulting in an occurrence of Rubbing Mura, which is a defect in fine stripes.

Along a moving direction (direction a) of the rubbing cloth, when the binding region and the display region are in transition, that is, when the binding region is adjacent to the display region, a contact state between the fluff on the surface of the rubbing cloth and the rubbing surface may be ensured to be the same, and even if states of the fluff on the surface of the rubbing cloth in the binding region and the display region are different, the Rubbing Mura problem may be improved.

In this regard, embodiments of the present disclosure provide an array substrate, which includes a display region and a binding region located at a side of the display region; the binding region includes a first conductive layer disposed on the substrate and a planarization layer disposed at a side of the first conductive layer away from the substrate. The binding region includes a binding zone and a vacancy zone alternately disposed along an edge of the display region, the first conductive layer includes binding pins disposed in the binding zone, and the planarization layer is provided with first openings exposing binding pins and covering the binding zone and the vacancy zone.

According to the embodiment of the disclosure, the first openings are formed in both the binding zone and the vacancy zone, so that a step difference of the binding region along an edge direction of the display region is eliminated, same fluff state on a surface of the rubbing cloth is ensured in a rubbing process, thereby preventing Rubbing Mura problem, and improving yield and display quality of the display apparatus.

A technical solution of the array substrate according to an embodiment of the present disclosure is illustrated below with reference to the accompanying drawings.

Figure 6A:
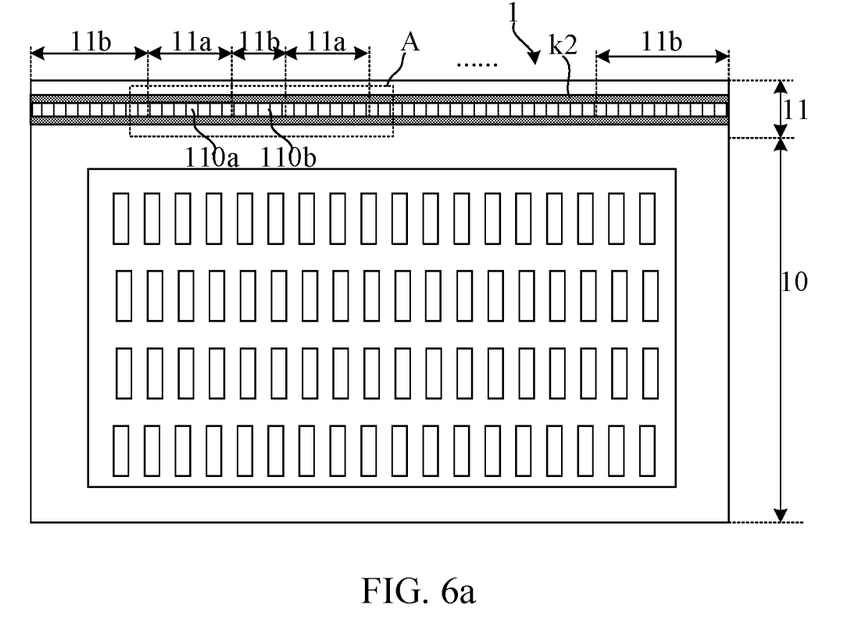
FIG. 6a is a diagram of a structure of an array substrate according to an embodiment of the present disclosure.
Figure 6B:
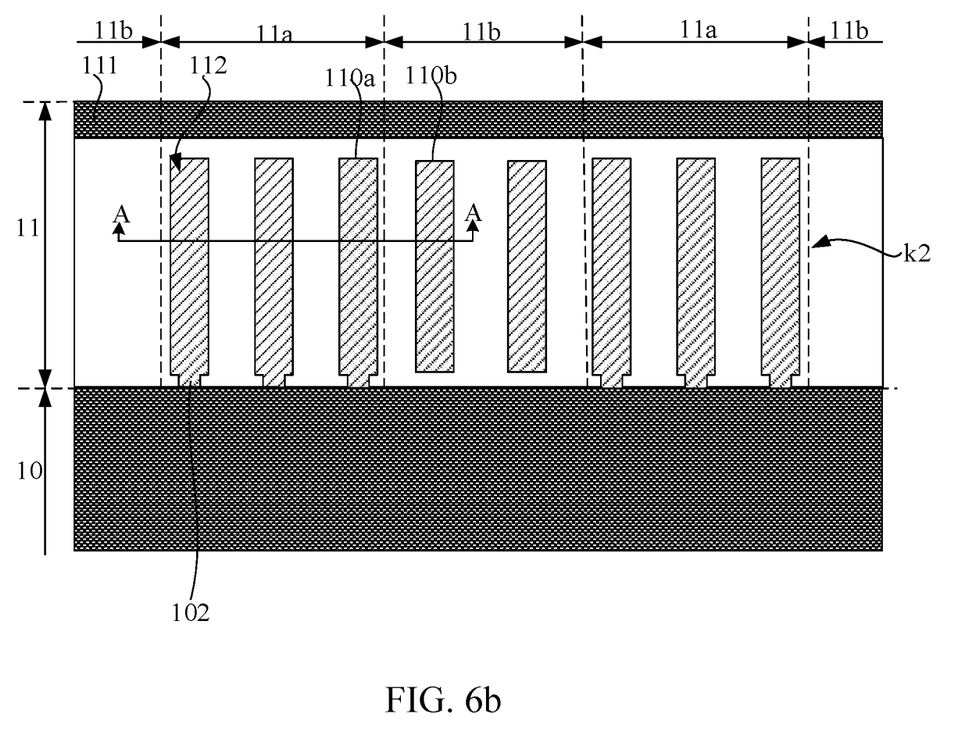
Figure 6C:
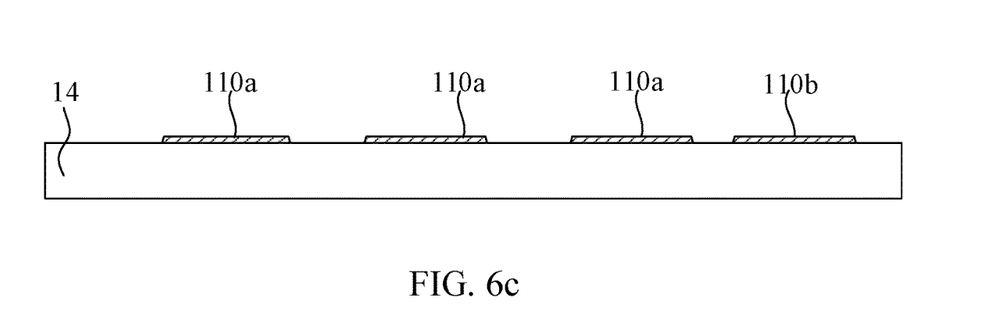
FIG. 6c is a sectional view at the position A-A in FIG. 6b.

FIG. 6a is a diagram of a structure of an array substrate according to an embodiment of the present disclosure; and FIG. 6b is an enlarged view at the position A in FIG. 6a; and FIG. 6c is an enlarged view at the position A-A in FIG. 6b. As shown in FIGS. 6a, 6b and 6c, an array substrate 1 includes a display region 10 and a binding region 11 disposed on a side of the display region 10. The display region 10 is used for displaying a picture, and the binding region 11 is used for binding with a driving chip. The binding region 11 of the array substrate 1 includes a first conductive layer 112 disposed on the substrate 14 and a planarization layer 111 disposed on a side of the first conductive layer 112 away from the substrate 14. The binding region 11 includes binding zones 11a and vacancy zones 11b alternately disposed along an edge of the display region 11. The first conductive layer 112 includes a plurality of binding pins 110a disposed in the binding zone 11a. The binding pins 110a are used for binding with driving chips, and driving signals are connected to thin film transistors on the display region 10 through fan-out wires 102 to realize signal input. The driving chip may be an integrated circuit (IC) or a Chip on Film (COF). The planarization layer 111 is provided with a first opening k2 exposing a plurality of binding pins 110a and covering the binding zone 11a and the vacancy zone 11b. In an example, the substrate 14 is a glass substrate. The first conductive layer 112 is a metal layer, and materials of the first conductive layer 112 include gold, silver, aluminum or copper. The planarization layer 111 is made of an organic material, which may be called an organic layer (ORG). The material of the planarization layer includes photoresist, which may be positive resist and negative resist.

According to the embodiment of the present disclosure, the first opening k2 is opened in both the binding zone 11a and the vacancy zone 11b, and all the planarization layers in the first opening k2 are etched away, thereby eliminating a step difference of the binding region along an edge direction of the display region. When rubbing cloth moves to the binding zone and the vacancy zone, fluff states on a surface of the rubbing cloth may be basically the same in the binding zone and the vacancy zone, thereby preventing Rubbing Mura problem, and improving yield and display quality of the display apparatus.

In an exemplary embodiment, the first opening k2 covers an entire binding region 11, that is, all the planarization layers 111 of the binding region 11 are etched away.

Since the binding zone 11a is provided with a binding pin 110a, there is a height difference of at least one binding pin between the vacancy zone 11b and the binding zone 11a in the first opening k2. However due to a small thickness of the binding pin, it basically will not cause Rubbing Mura problems. However, in order to reduce a risk of Rubbing Mura, and try to avoid a step difference between the vacancy zone 11a and the binding zone 11b, in an exemplary embodiment, as shown in FIGS. 6a and 6b, the first conductive layer 112 includes a plurality of occupation pins 110b disposed in the vacancy zone 11b. The occupation pin 110b is not connected to the fan-out wire 102, and is only used to eliminate a step difference between the vacancy zone 11b and the binding zone 11a. In an example, as shown in FIGS. 6b and 6c, structures of the binding pin 110a and the occupation pin 110b are the same, and "same" here includes same thicknesses of the binding pin 110a and the occupation pin 110b are the same, and same shapes and sizes of an orthographic projection of the binding pin 110a on the substrate 14 and an orthographic projection of the occupation pin 110b on the substrate 14. In this exemplary embodiment, by disposing the occupation pin 110b in the vacancy zone 11b, the occupation pin 110b may make a compression state of the fluff on the surface of the rubbing cloth in the vacancy zone 11b close to a compression state of the fluff on the surface of the rubbing cloth in the binding zone 11a in a rubbing process, thereby ensuring a same state of the fluff on the surface of the rubbing cloth in the first opening k2, further reducing the risk of Rubbing Mura problem and improving the yield and display quality of the display apparatus.

In an exemplary embodiment, distances between adjacent binding pins 110a and occupation pins 110b, between adjacent binding pins 110a and between adjacent occupation pins 110b are the same, and in an example, the distance is smaller than 1.5 mm, e.g., 1 mm.

Figure 7A:
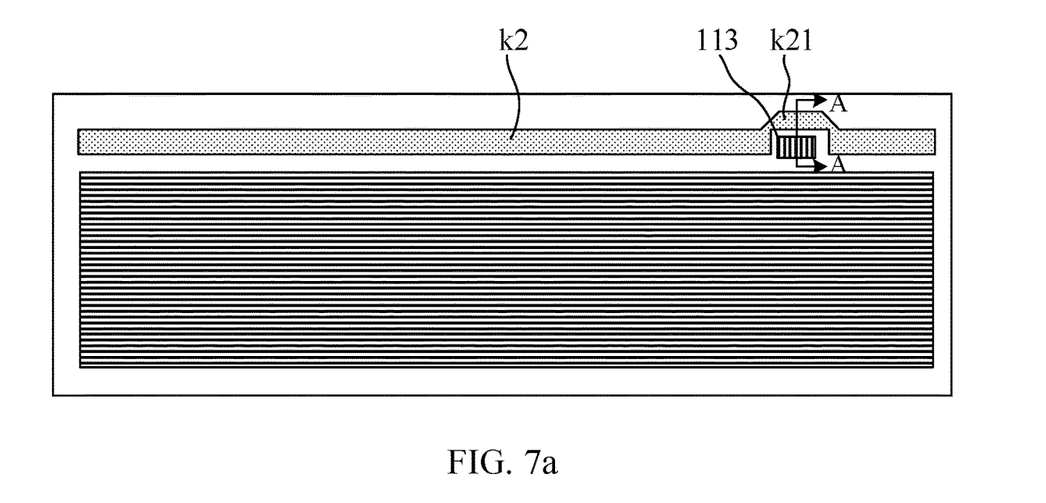
FIG. 7a is a schematic diagram of a structure of an array substrate according to an exemplary embodiment of the present disclosure.
Figure 7B:
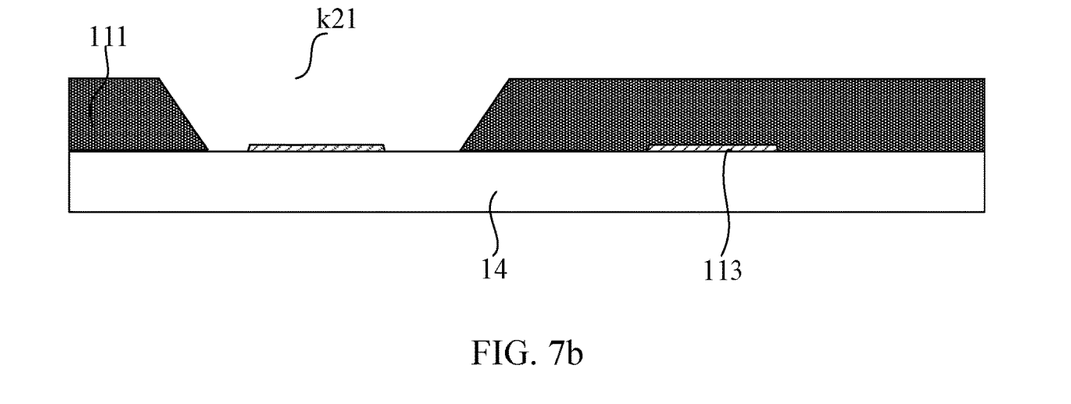

FIG. 7a is a schematic diagram of a structure of an array substrate according to an exemplary embodiment of the present disclosure. FIG. 7b is a sectional view at the position A-A in FIG. 7a. In an exemplary embodiment, as shown in FIGS. 7a and 7b, the binding region 11 further includes a substrate mark 113, and the first opening k2 includes an avoidance zone k21 that avoids the substrate mark 113. The substrate mark 113 is disposed on the substrate and covered by the planarization layer 111. The substrate mark is disposed on a same layer as the first conductive layer. The substrate mark 113 is used as an identity mark of the array substrate, accompanying the whole production cycle or product cycle of the array substrate. The first opening k2 includes an avoidance zone k21 avoiding the substrate mark 113, that is, a position of the planarization layer 111 corresponding to the substrate mark 113 is reserved, thereby preventing the substrate mark 113 from being corroded. In this example, an orthographic projection of the avoidance zone k21 of the first opening k2 on the substrate 14 includes a V shape and a U shape.

Figure 8:
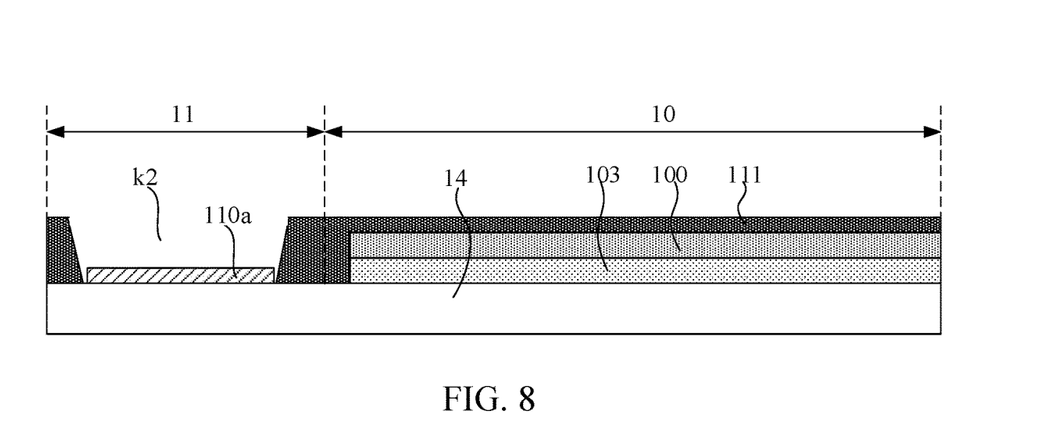
FIG. 8 is a schematic diagram of a structure of another array substrate according to an exemplary embodiment of the present disclosure.

FIG. 8 is a schematic diagram of a structure of another array substrate according to an exemplary embodiment of the present disclosure. In an exemplary embodiment, as shown in FIG. 8, the display region 10 includes an array structure layer 103 disposed on the substrate 14 and a color filter layer 100 disposed on the array structure layer 103, wherein the planarization layer 111 covers the color filter layer 100, and the planarization layer 111 is used for balance a step difference of the color filter layer 100.

Figure 9:
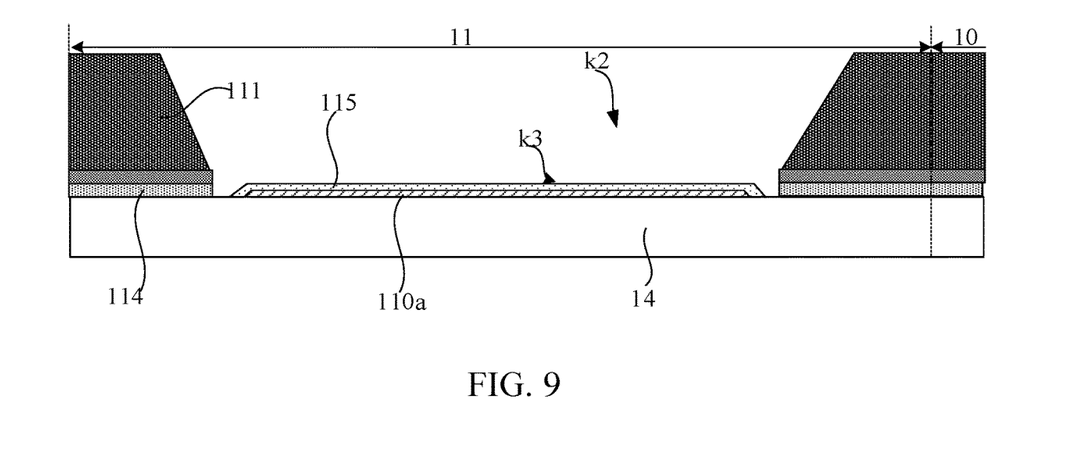
FIG. 9 is a sectional view of a binding region of another array substrate according to an exemplary embodiment of the present disclosure.

FIG. 9 is a sectional view of a binding region of another array substrate according to an exemplary embodiment of the present disclosure, and FIG. 9 shows a sectional view in a direction perpendicular to an extending direction of the binding zone. In an exemplary embodiment, as shown in FIG. 9, the binding region 11 further includes a passivation layer 114, which is disposed between the first conductive layer 112 and the planarization layer 111; the passivation layer 114 is provided with a second opening k3; and an orthographic projection of the first opening k2 on the substrate 14 includes an orthographic projection of the second opening k3 on the substrate 14. "Including" here means that the orthographic projection of the second opening k3 on the substrate 14 overlaps the orthographic projection of the first opening k2 on the substrate 14, or that the orthographic projection of the second opening k3 on the substrate 14 lies within a range of the orthographic projection of the first opening k2 on the substrate 14. In an example, an array structure layer includes a gate electrode disposed on a substrate, a first insulating layer disposed on the gate electrode, an active layer disposed on the first insulating layer, a source-drain metal layer disposed on the active layer and a second insulating layer disposed on the source-drain metal layer; or the array structure layer includes an active layer disposed on the substrate, a first insulating layer disposed on the active layer, a gate electrode disposed on the first insulating layer, a second insulating layer disposed on the gate electrode, and a source-drain metal layer disposed on the second insulating layer. The passivation layer includes at least one of a first insulating layer and a second insulating layer. The first insulating layer may also be called a gate insulating layer, and the source-drain metal layer includes a source electrode, a drain electrode and a data line. The source electrode, the drain electrode, the active layer and the gate electrode constitute a thin film transistor.

As shown in FIG. 9, the binding region 11 also includes a second conductive layer 115, which is disposed in the first opening k1; the second conductive layer 115 includes a plurality of conductive units 115a disposed at intervals, and the plurality of conductive units 115a and the binding pins 110a are in a one-to-one correspondence; an orthographic projection of the conductive units 115a on the substrate 14 covers an orthographic projection of the binding pins 110a on the substrate 14. The first conductive layer may be made of indium tin oxide (ITO), aluminum-doped zinc oxide (AZO), etc. In another example, a plurality of conductive units 115a are in a one-to-one correspondence with the binding pins 110a and the occupation pins 110b.

Figure 10:
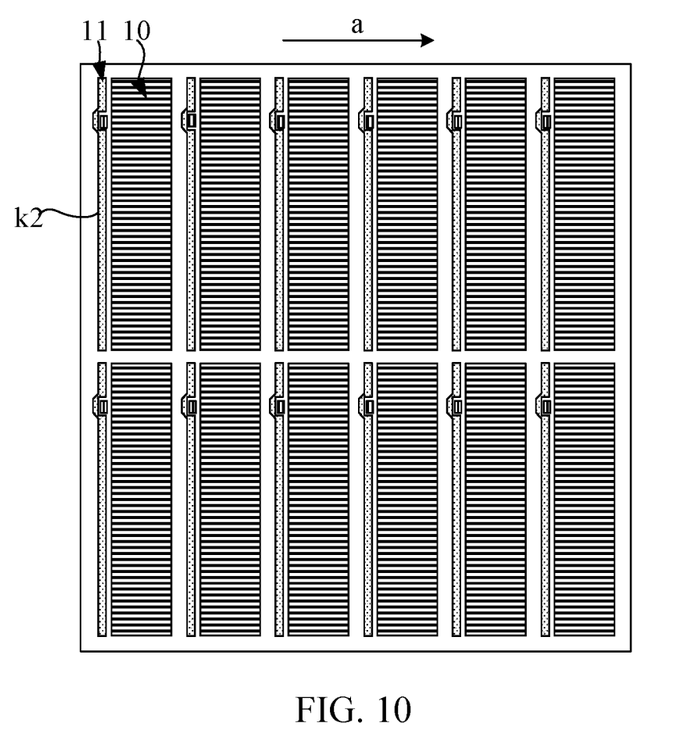
FIG. 10 is a process diagram of an array motherboard according to an exemplary embodiment of the present disclosure.

FIG. 10 is a process diagram of an array motherboard according to an exemplary embodiment of the present disclosure. As shown in FIG. 10, rubbing cloth combs an alignment film along direction a to form a rubbing channel. The rubbing cloth may first pass through the binding region 11 and then the display region 10, or may first pass through the display region 10 and then pass through the binding region 11. The binding region has a first opening k2 covering the binding zone and the vacancy zone. Elastic forces of fluff on a surface of the rubbing cloth inside the first opening k2 and outside the first opening k2 are different. However, since the first opening k2 is disposed along an edge of the display region and the vacancy zone is provided with occupation pins, states of the fluff on the surface inside the first opening k2 are the same and states of the fluff on the surface outside the first opening k2 are the same. Although the fluff on the surface of the rubbing cloth transitions from the inside of the first opening k2 to the outside of the first opening k2 are different, under an action of the transition, the fluff on the surface is in a same state, which effectively prevents Rubbing Mura.

In addition, according to an embodiment of the disclosure, a first via hole is opened in the planarization layer, which reduces a patterning process compared with the first mode and is compatible with the existing process, thereby ensuring the product quality without increasing the production cost.

An embodiment of the present disclosure further provides a display apparatus which includes the array substrate of any above-mentioned embodiments or implementations. The display apparatus may include a tablet, a mobile phone, a computer and a television.

Although the embodiments disclosed in the present disclosure are as described above, the content described is merely embodiment for facilitating the understanding of the present disclosure and is not used to limit the present disclosure. Any person skilled in the art to which the present disclosure pertains may make modifications and variations in implementation forms and details without departing from the essence and scope of the present disclosure, but the scope of patent protection of the present disclosure should still be determined by the scope of the appended claims.

What we claim is:

1. An array substrate, comprising a display region and a binding region located at a side of the display region, wherein
   the binding region comprises a first conductive layer disposed on the substrate and a planarization layer disposed at a side of the first conductive layer away from the substrate;
   the binding region comprises a binding zone and a vacancy zone alternately disposed along an edge of the display region;
   the first conductive layer comprises a plurality of binding pins disposed in the binding zone; and
   the planarization layer is provided with first openings exposing the plurality of binding pins and covering the binding zone and the vacancy zone;
   wherein the first conductive layer further comprises occupation pins disposed in the vacancy zone, and the occupation pins and the binding pins are disposed at intervals along the edge of the display region;
   wherein distances between the adjacent binding pins, between the adjacent occupation pins and between the adjacent occupation pin and the binding pin are the same.

2. The array substrate of claim 1, wherein
   the binding region extends along an edge of the display region, and
   widths of the binding zone and the vacancy zone is the same as widths of the binding pins in a direction perpendicular to an extending direction of the binding zone.

3. The array substrate of claim 1, wherein the first opening covers the entire binding region.

4. The array substrate of claim 1, wherein the binding pin and the occupation pin have a same structure.

5. The array substrate of claim 1, wherein the binding region further comprises a substrate mark disposed on the substrate, and the first opening comprises an avoidance zone avoiding the substrate mark.

6. The array substrate of claim 1, wherein
   the binding region further comprises a passivation layer disposed between the first conductive layer and the planarization layer,
   a second opening is disposed on the passivation layer, and
   an orthographic projection of the first opening on the substrate overlaps an orthographic projection of the second opening on the substrate.

7. The array substrate of claim 2, wherein
   the binding region further comprises a passivation layer disposed between the first conductive layer and the planarization layer,
   a second opening is disposed on the passivation layer, and
   an orthographic projection of the first opening on the substrate overlaps an orthographic projection of the second opening on the substrate.

8. The array substrate of claim 3, wherein
   the binding region further comprises a passivation layer disposed between the first conductive layer and the planarization layer,
   a second opening is disposed on the passivation layer, and
   an orthographic projection of the first opening on the substrate overlaps an orthographic projection of the second opening on the substrate.

9. The array substrate of claim 1, wherein the binding region further comprises a second conductive layer disposed in the first opening, and the second conductive layer comprises a plurality of conductive units disposed at intervals, and the plurality of conductive units and the binding pins are in a one-to-one correspondence; or,
   the plurality of conductive units are in a one-to-one correspondence with the binding pins and the occupation pins.

10. A display apparatus, comprising: an array substrate, wherein
    the array substrate comprises a display region and a binding region located at a side of the display region;
    the binding region comprises a first conductive layer disposed on the substrate and a planarization layer disposed at a side of the first conductive layer away from the substrate;
    the binding region comprises a binding zone and a vacancy zone alternately disposed along an edge of the display region; the first conductive layer comprises a plurality of binding pins disposed in the binding zone; and the planarization layer is provided with first openings exposing binding pins and covering the binding zone and the vacancy zone;

wherein the first conductive layer further comprises occupation pins disposed in the vacancy zone, and the occupation pins and the binding pins are disposed at intervals along the edge of the display region;

wherein distances between the adjacent binding pins, between the adjacent occupation pins and between the adjacent occupation pin and the binding pin are the same.

11. The display apparatus of claim 10, wherein the binding region extends along an edge of the display region, and widths of the binding zone and the vacancy zone is the same as widths of the binding pins in a direction perpendicular to an extending direction of the binding zone.

12. The display apparatus of claim 10, wherein the first opening covers the entire binding region.

13. The display apparatus of claim 10, wherein the binding pin and the occupation pin have a same structure.

14. The display apparatus of claim 10, wherein the binding region further comprises a substrate mark disposed on the substrate, and the first opening comprises an avoidance zone avoiding the substrate mark.

15. The display apparatus of claim 10, wherein the binding region further comprises a passivation layer disposed between the first conductive layer and the planarization layer, and a second opening is disposed on the passivation layer, and an orthographic projection of the first opening on the substrate overlaps an orthographic projection of the second opening on the substrate.

16. The display apparatus of claim 10, wherein the binding region further comprises a second conductive layer disposed in the first opening, and the second conductive layer comprises a plurality of conductive units disposed at intervals, and the plurality of conductive units and the binding pins are in a one-to-one correspondence; or, the plurality of conductive units are in a one-to-one correspondence with the binding pins and the occupation pins.

* * * * *